(12) United States Patent
Imam et al.

(10) Patent No.: US 6,555,877 B2
(45) Date of Patent: Apr. 29, 2003

(54) NMOSFET WITH NEGATIVE VOLTAGE CAPABILITY FORMED IN P-TYPE SUBSTRATE AND METHOD OF MAKING THE SAME

(75) Inventors: Mohamed Imam, Tempe, AZ (US); Raj Nair, Chandler, AZ (US); Mohammed Tanvir Quddus, Tempe, AZ (US); Masaru Suzuki, Aizuwakamatsu (JP); Takeshi Ishiguro, Aizuwakamatsu (JP); Jefferson W. Hall, Phoenix, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/939,552

(22) Filed: Aug. 27, 2001

(65) Prior Publication Data

US 2003/0038324 A1 Feb. 27, 2003

(51) Int. Cl.[7] .................. H01L 27/01; H01L 27/12; H01L 31/0392; H01L 23/62
(52) U.S. Cl. .................. 257/355; 257/348; 257/357
(58) Field of Search ................. 257/355, 348, 257/357, 365, 173, 546, 371, 296, 369, 182

(56) References Cited

U.S. PATENT DOCUMENTS

| RE35,613 E | * | 9/1997 | Yasuda et al. ............... 257/296 |
|---|---|---|---|
| 5,912,495 A | * | 6/1999 | Depetro et al. ............... 257/355 |
| 5,963,799 A | * | 10/1999 | Wu ............................. 438/199 |
| 5,977,594 A | * | 11/1999 | Takao .......................... 257/173 |
| 6,066,863 A | * | 5/2000 | Fujishima .................... 257/120 |
| 6,091,113 A | * | 7/2000 | Tanaka ......................... 257/348 |
| 6,144,583 A | * | 11/2000 | Shiba ..................... 365/185.11 |
| 6,150,676 A | * | 11/2000 | Sasaki .......................... 257/191 |
| 6,242,787 B1 | * | 6/2001 | Nakayama et al. .......... 257/335 |
| 6,303,417 B1 | * | 10/2001 | Wu ............................. 438/199 |

* cited by examiner

*Primary Examiner*—John F. Niebling
*Assistant Examiner*—Walter L. Lindsay, Jr.

(57) ABSTRACT

A semiconductor device (10,50) is disclosed which can accommodate a negative voltage on its source using a P-type substrate (12) which is connected to ground potential. A first embodiment illustrates a device which can handle high voltage applications as well as a negative voltage applied to the source. A drain contact region (29) is recessed by a dimension (X) from a first insulated region (18). The dimension (X) provides for an optimum distance for high voltage applications while avoiding lateral surface punch-through. A second embodiment illustrates a gate structure (52) having a shape which surrounds a drain contact region (62) and accommodates a high voltage application while also eliminating the lateral surface punch-through. The drain contact region (62) is formed in a P-type region (20) centered inside the gate structure (52).

7 Claims, 4 Drawing Sheets

NMOSFET WITH NEGATIVE VOLTAGE CAPABILITY FORMED IN P-TYPE SUBSTRATE AND METHOD OF MAKING THE SAME

BACKGROUND OF THE INVENTION

The present invention relates in general to electronic devices and, more particularly, to semiconductor devices used in battery protection circuits.

Batteries are used in a wide variety of applications including digital pagers, cellular telephones, and in general, portable computer electronics. Batteries employed in portable electronics include lithium ion, lithium polymer, or nickel-cadmium compositions. Many of the portable electronic devices have a battery protection circuit which senses a battery cell voltage, the charge and discharge of current, and maintains the battery cell device within operating specifications. When the battery is charged up to a maximum potential, a control switch changes state and a voltage polarity switch occurs. Thus, the battery protection device can be exposed to a negative voltage resulting in electrical damage if the device is not able to tolerate a negative voltage. Because of this negative voltage, it is desirable to have a battery protection circuit which can handle a negative voltage applied to source terminals of N-type Metal Oxide Semiconductor Field Effect Transistor (NMOSFET) devices which may be contained within the battery protection circuit.

In the prior art, an NMOSFET device whose source can handle a negative voltage has an N-type substrate with a P-type well region formed within the N-type substrate. The N-type substrates, however, are not common on conventional Complementary Metal Oxide Semiconductor Field Effect Transistor (CMOSFET) technologies. The conventional technology uses a P-type substrate for MOSFET devices. A second example of a device whose source can handle a negative voltage has a P-type substrate, an N-type epi region formed within the substrate, and a P-type well region formed within the N-type epi region. The second example has a device which uses a P-type substrate used in the conventional CMOS technology. The second example, however, has a disadvantage in that the process is expensive and does not have good isolation between devices built using the same substrate. Typically, in such epi technologies, the devices are separated from each other by a deep P-type region formed within the N-type epi region. The added region adds complexity and an unnecessary expense. Further, an N-type epi region must also be formed in the P-type substrate. The P-type well region being formed within the N-type epi region.

Thus, a need exists to have an MOSFET device for battery protection circuits that can handle a negative voltage on its source, with respect to the substrate potential of the MOSFET device, using a P-type substrate without the added expense of the prior art devices. The invention disclosed herein will address the above problems.

DETAILED DESCRIPTION OF THE DRAWINGS

Figure 1:
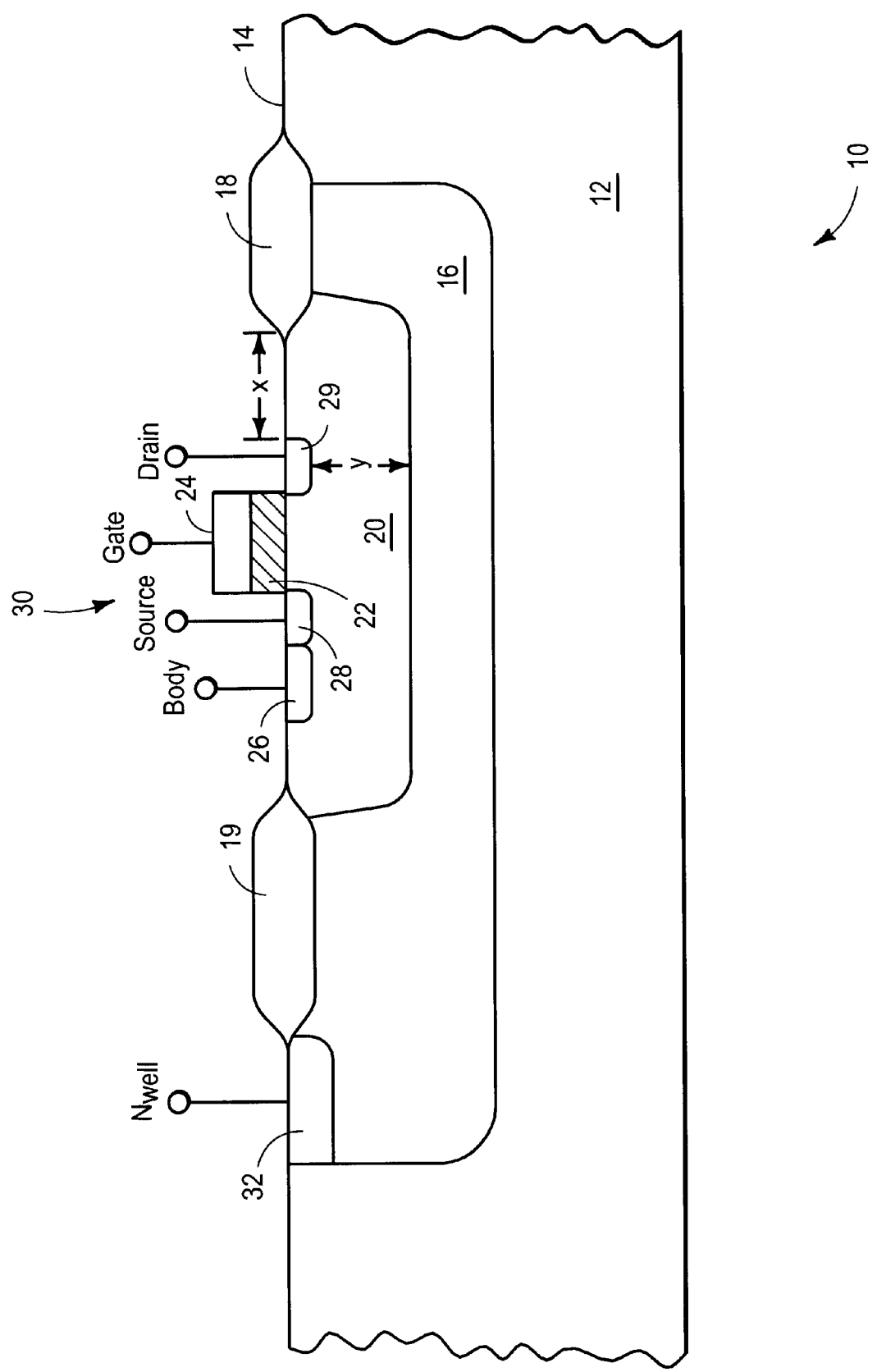
FIG. 1 is a cross-sectional view of an N-channel MOSFET device formed in a P-type region, where the P-type region is formed in an N-type well region which is formed in a P-type substrate.

FIG. 1 illustrates a cross-sectional view of a portion of NMOSFET semiconductor device 10. Device 10 includes substrate region 12 having major surface 14. Substrate region 12 is typically comprised of a boron material having a resistivity of 14 to 22 ohms-cm. Well region 16 is formed extending down from major surface 14 to a typical junction depth of 6 microns by implant and diffusion of N-type carriers into substrate region 12. Well region 16 is an N-type region with a typical surface concentration of $8 \times 10^{15}$ cm$^{-3}$. First insulated region 18 is formed at major surface 14 and substantially within well region 16 having a typical oxide thickness of $10 \times 10^3$ angstroms. First insulated region 18 is formed at one end of well region 16, such that region 18 extends horizontally along major surface 14, through well region 16 and into substrate region 12. Second insulated region 19 is formed concurrently with insulated region 18 on the opposite end of well region 16. Second insulated region 19 is formed along major surface 14 substantially within well region 16 and having a typical oxide thickness of $10 \times 10^3$ angstroms. P-region 20 is formed within well region 16 using the ends of first insulated region 18 and second insulated region 19 as an alignment. P-region 20 is typically a high voltage P-region (PHV) having a junction depth of 1 to 2 microns and a surface concentration of $1 \times 10^{17}$ cm$^{-3}$. Thus, P-region 20 is a P-type doped diffused region which is formed in N-type doped well region 16. Further, N-well region 16 is formed in P-type substrate region 12.

Gate oxide 22 is formed between insulated regions 18 and 19 on major surface 14. The thickness of gate oxide 22 is typically 300 angstroms for a 15 volt application. To form gate structure 30 for semiconductor device 10, gate electrode 24 is formed above gate oxide 22. Gate electrode 24 is typically formed of a polysilicon material. Implantation of P-type region 26 forms a highly doped P-region for a body contact of semiconductor device 10. P-type region 26 is typically formed within P-region 20 using a highly doped implantation of 0.3 microns in thickness. Typically, a body contact is connected to P-type region 26. Between gate structure 30 and P-type body region 26 is N-type source region 28. N-type source region 28 is a highly doped region formed typically to 0.3 microns in thickness within P-region 20. Typically, a source contact is connected to N-type source region 28. N-type drain region 29 is formed on the opposite end of gate structure 30 from source region 28. N-type drain region 29 is a highly doped region formed typically to 0.3 microns in thickness within P-region 20. Typically, a drain contact is connected to N-type drain region 29.

Traditional prior art devices form an N-type region for a drain contact by self-aligning the N-type drain region with gate structure 30 and first insulated region 18. The N-type region is in contact with gate oxide 22 of gate structure 30 and in contact with first insulated region 18, which makes the prior art devices subject to lateral punch through. Semiconductor device 10, however, is formed for high voltage applications to allow negative voltages to the source contact of device 10, with respect to the N-well or substrate potential. To allow for optimum high voltage applications, second N-type region 29 is recessed a critical distance, X, from first insulated region 18, as discussed below.

In operation, N-type device 10 remains non-conductive if the voltage applied to gate terminal GATE is at or below the threshold voltage of device 10 with respect to the voltage applied to source terminal SOURCE. Once a voltage greater than the threshold of device 10 is applied to terminal GATE, with respect to terminal SOURCE, a conduction channel forms under gate structure 30 in P-well 20, between source region 28 and N-type drain region 29. The conduction channel formed by a positive voltage, exceeding the threshold of device 10, applied to terminal GATE, with respect to terminal SOURCE, is effective to render device 10 conductive.

Figure 2:
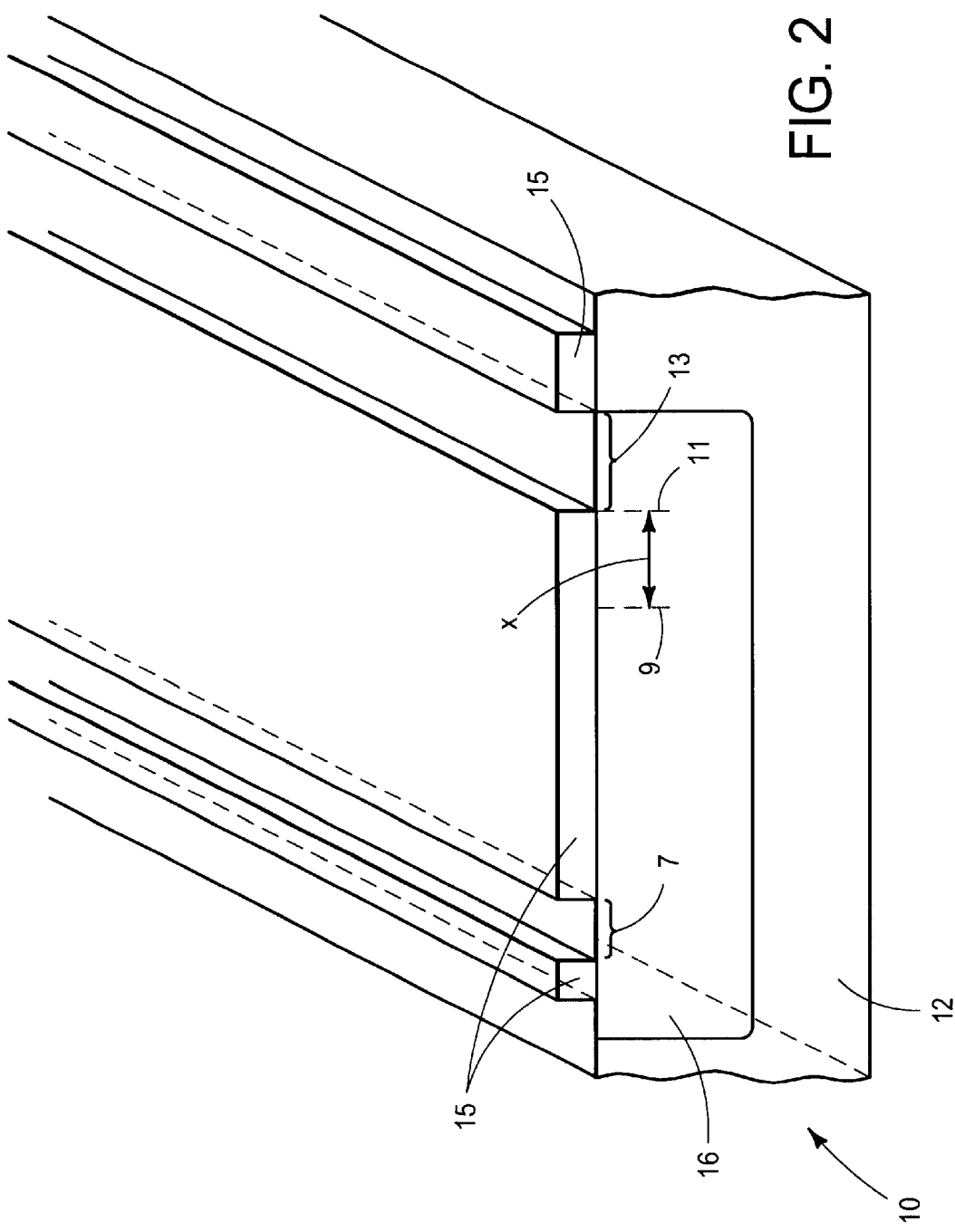
FIG. 2 illustrates the device of FIG. 1 during a preliminary manufacturing step.

FIG. 2 illustrates NMOSFET semiconductor device 10 at a preliminary manufacturing stage, to further illustrate the critical separation distance, X, of N-type region 29 from first insulated region 18. N-well region 16 is formed into P-type substrate 12. Nitride layers 15 are deposited on the top surface of P-type substrate 12, defining regions 7 and 13 that are not covered by nitride layer 15. The right edge of center nitride region 15 is defined by dimension 11. Dimension 9 defines the eventual alignment of the right wall of N-type drain region 29, with respect to dimension 11. The distance between dimension 9 and dimension 11 is defined to be the critical dimension X. Regions 7 and 13 define areas on the top surface of substrate 12 that are not covered by nitride layer 15. Nitride layers 15 provide a mask during a high temperature oxidation step, substantially eliminating oxide growth on all portions of substrate 12 covered by nitride layer 15, but allowing oxide growth in regions 7 and 13 which are not covered by nitride layer 15. Insulated region 19, illustrated in FIG. 1, forms within region 7 and insulated region 18, illustrated in FIG. 1, forms within region 13, during the high temperature oxidation step. The formation of insulated regions 18 and 19 causes extrusions of oxide, into nitride regions 15, resembling the structure of a bird's beak.

Dimension X is the separation distance between the right wall of N-type drain region 29, shown as dimension 9, and the left wall of insulated region 18, shown as dimension 11, as discussed above. The separation distance, X, is defined by equation (1), $$X \geq \alpha * \sqrt{V_{nwell} - V_{body}} * \left( \sqrt{\frac{N_{drain}}{N_{body}(N_{drain} + N_{body})}} + \sqrt{\frac{N_{nwell}}{N_{body}(N_{nwell} + N_{body})}} \right), \quad (1)$$

where $N_{drain}$ is the doping concentration of N-type drain region 29, $N_{body}$ is the doping concentration of P-region 20, and $N_{well}$ is the doping concentration of N-well region 16. $\alpha$ is a multiplication constant to be discussed hereinafter. Equation (1) relates critical distance X to be a function of the square root of the difference in potential between N-well region 16 and body region 26. Terminal BODY and terminal SOURCE may be coupled together. Terminal DRAIN and terminal $N_{well}$ may also be coupled together to a top rail power supply potential, for example. For a given voltage applied across terminals DRAIN and SOURCE, dimension X determines the minimum distance that the right wall of N-type drain region 29 can be recessed from insulated region 18, in order to substantially eliminate lateral surface punch-through from N-type drain region 29 to N-well region 16, for the given applied voltage across terminals DRAIN and SOURCE.

A typical value for $V_{nwell}$ is 5 volts and a typical voltage for $V_{body}$ is −12 volts, for example. $V_{body}$ is the voltage applied to P-region 20 at terminal BODY, and $V_{nwell}$ is the voltage applied to N-well region 16 at terminal N-well. Typical concentrations for N-well region 16, P-well region 20 and N-type drain region 29 are $3\times10^{16}$ cm$^{-3}$, $1\times10^{17}$ cm$^{-3}$ and $1\times10^{20}$ cm$^{-3}$, respectively. A typical value for the multiplication constant, $\alpha$, is $3.63\times10^3$, where $$\alpha = \sqrt{\frac{2*\varepsilon_o \varepsilon_R}{q}}.$$

$\varepsilon_o$ is the permittivity of free space, or $8.85\times10^{-14}$, $\varepsilon_R$ is the relative permittivity of silicon material, or 11.9, and q is the elementary electronic charge, or $1.6\times10^{-19}$. Given the typical values above, X is calculated to be $7\times10$–5 cm, or 0.7 micrometers ($\mu$m). That is to say, that given a maximum voltage difference between N-well region 16 and N-type drain region 29 of 17 volts and typical doping concentrations as given above, the minimum critical distance X is calculated to be 0.7 $\mu$m. Equation (1) assumes that the junction between N-type drain region 29 and P-well region 20 and the junction between P-well region 20 and N-well region 16 are planar junctions, which provides a worst case approximation for the magnitude of critical dimension X. Equation (1), therefore, provides a maxima of the minimum value for X, since any junctions other than planar junctions would yield smaller values of critical dimension X.

An advantage of the semiconductor device illustrated in FIG. 1 is provided through the isolation of P-well region 20 by N-well region 16. N-well region 16 allows a bias potential to be placed on body region 20, which is different than the bias potential applied to P-substrate 12. In the absence of N-well region 16, body region 26 would be forced to the bias potential of P-substrate 12. By isolating P-well region 20 with N-well region 16, voltages at the source and drain connections to semiconductor device 10 are allowed to vary, substantially without regard for bias potentials applied to P-substrate 12.

An additional advantage of semiconductor device 10 is given by the separation distance X, calculated by equation (1), which substantially eliminates lateral surface punch-through from N-type drain region 29 to N-well region 16 for given body to N-well region potential differences and doping concentrations. Device 10 is designed to provide a minimum lateral surface punch-through voltage given by the doping concentrations of P-well region 20, N-well region 16 and N-type drain region 29, which is greater than the vertical punch-through voltage normally associated with the vertical distance between N-type drain region 29 and N-well region 16, illustrated by dimension y.

Figure 3:
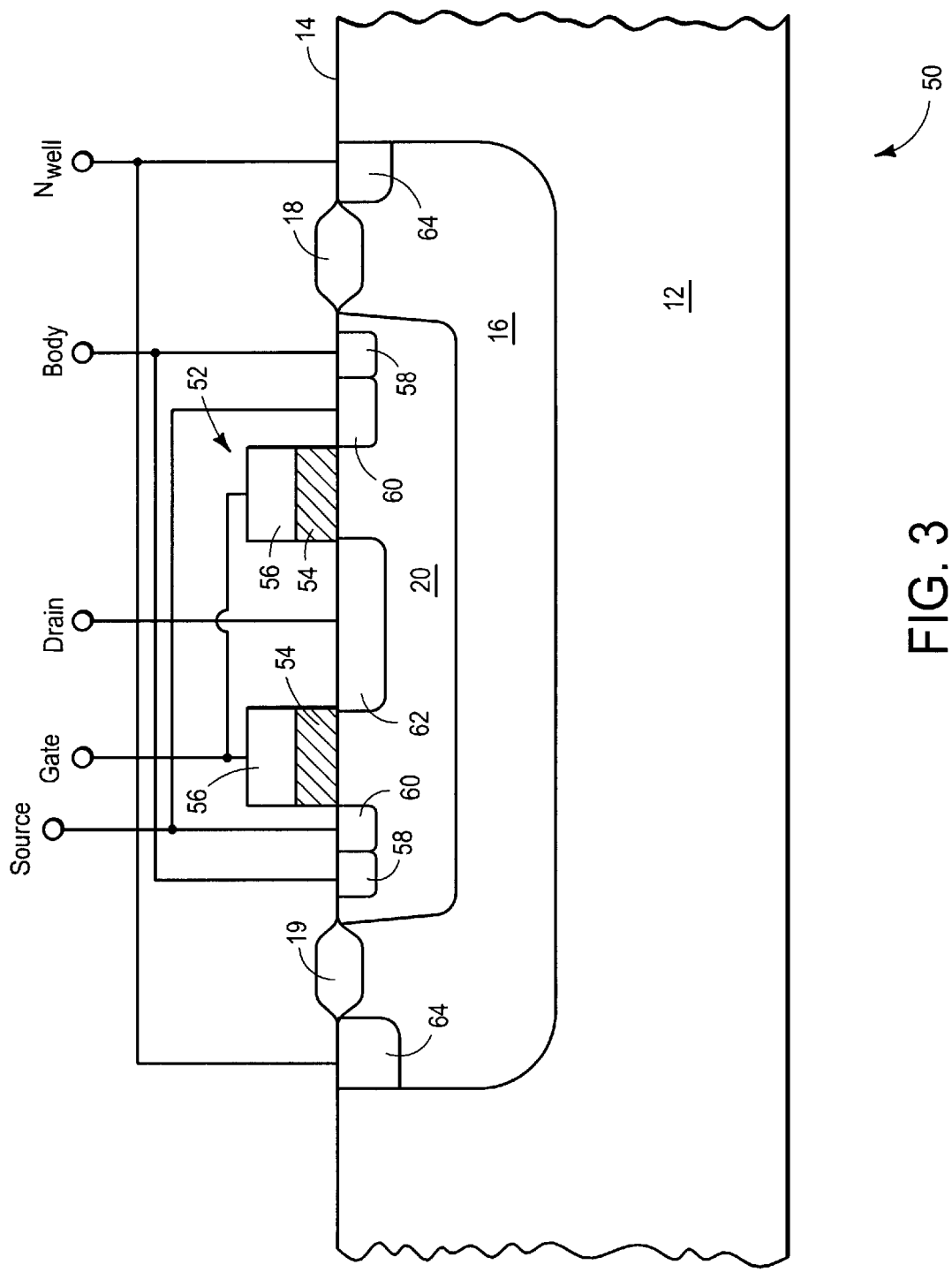
FIG. 3 is a cross-sectional view of an N-channel MOSFET device formed in a P-type region, where the P-type region is formed in an N-type well region which is formed in a P-type substrate and having a gate structure surrounding the N-type drain region.

FIG. 3 illustrates a cross-sectional view of a portion of NMOSFET semiconductor device 50. Regions in FIG. 3 which are similar to regions shown in FIG. 1 are shown with the same figure designations. Device 50 includes substrate region 12 having major surface 14. N-well region 16 is formed extending down from major surface 14 to a typical junction depth of 6 microns by implant and diffusion into substrate region 12. First insulated region 18 is formed at major surface 14 and within well region 16 having a typical oxide thickness of $10\times10^3$ angstroms. Second insulated region 19 is formed on the opposite end of well region 16. Second insulated region 19 is formed along major surface 14 in well region 16 and having a typical oxide thickness of $10\times10^3$ angstroms. The formation of first and second insulated regions 18 and 19 is performed simultaneously. P-region 20 is formed within well region 16 using the ends of first insulated region 18 and second insulated region 19 as an alignment mechanism. P-region 20 is a P-type doped diffused region which is formed in N-type well region 16. Further, N-type well region 16 is formed in P-type substrate region 12.

Shaped gate structure 52 is formed on major surface 14. Gate oxide 54 is an oxide material formed to a thickness of typically 300 angstroms and follows the shape of shaped gate structure 52. Gate electrode 56 is a conductive electrode formed above gate oxide 54 and follows the shape of shaped gate structure 52. Shaped gate electrode 56 is typically formed of a polysilicon material.

A body contact BODY for semiconductor device 50 is formed with an implantation of P-type body region 58. P-type body region 58 is typically formed symmetrically on either side of shaped gate structure 52 within P-region 20. P-type body region 58 is typically a highly doped region of 0.3 microns in thickness. Between shaped gate structure 52 and P-type body region 58 is N-type source region 60. N-type source region 60 is a highly doped region formed typically to 0.3 microns in thickness within P-region 20. N-type source region 60 is comprised of source regions 60 formed on either side of shaped gate structure 52. N-type drain region 62 is centered between shaped gate structure 52 and forms the drain contact for semiconductor device 50. N-type drain region 62 is a highly doped region formed typically to 0.3 microns in thickness within P-region 20.

During operation of semiconductor device 50, a voltage is applied to drain contact DRAIN. As the voltage applied to the drain contact increases with respect to the source voltage at terminal SOURCE, N-type drain region 62 depletes into P-region 20 and eventually punches through into N-well region 16 when the voltage applied is equal to the vertical punch through voltage of device 50. Semiconductor device 50 substantially eliminates lateral surface punch-through, by locating the drain contact, i.e. N-type drain region 62, in a center position within P-type region 20. Thus, device 50 is a substantially lateral surface punch-through free device.

Adjacent to first and second insulated regions 18 and 19 is well contact region 64. Well contact region 64 is a highly doped, N-type region formed in N-well region 16 to a typical dimension of 0.3 microns. Well contact region 64 provides a contact to control the voltage applied to N-well region 16 to regulate the voltage $V_{nwell}$.

In operation, N-type device 50 remains non-conductive if the voltage applied to gate terminal GATE is at or below the threshold voltage of device 50 with respect to the voltage applied to source terminal SOURCE. Once a voltage greater than the threshold of device 50 is applied to terminal GATE, with respect to terminal SOURCE, conduction channels form under gate structures 52 in P-well 20. Once the conduction channels form under gate structures 52, conductive paths exists extending from source regions 60 to N-type drain region 62. The conduction channels formed by a positive voltage, exceeding the threshold of device 50, applied to terminal GATE, with respect to terminal SOURCE, is effective to render device 50 conductive.

Figure 4:
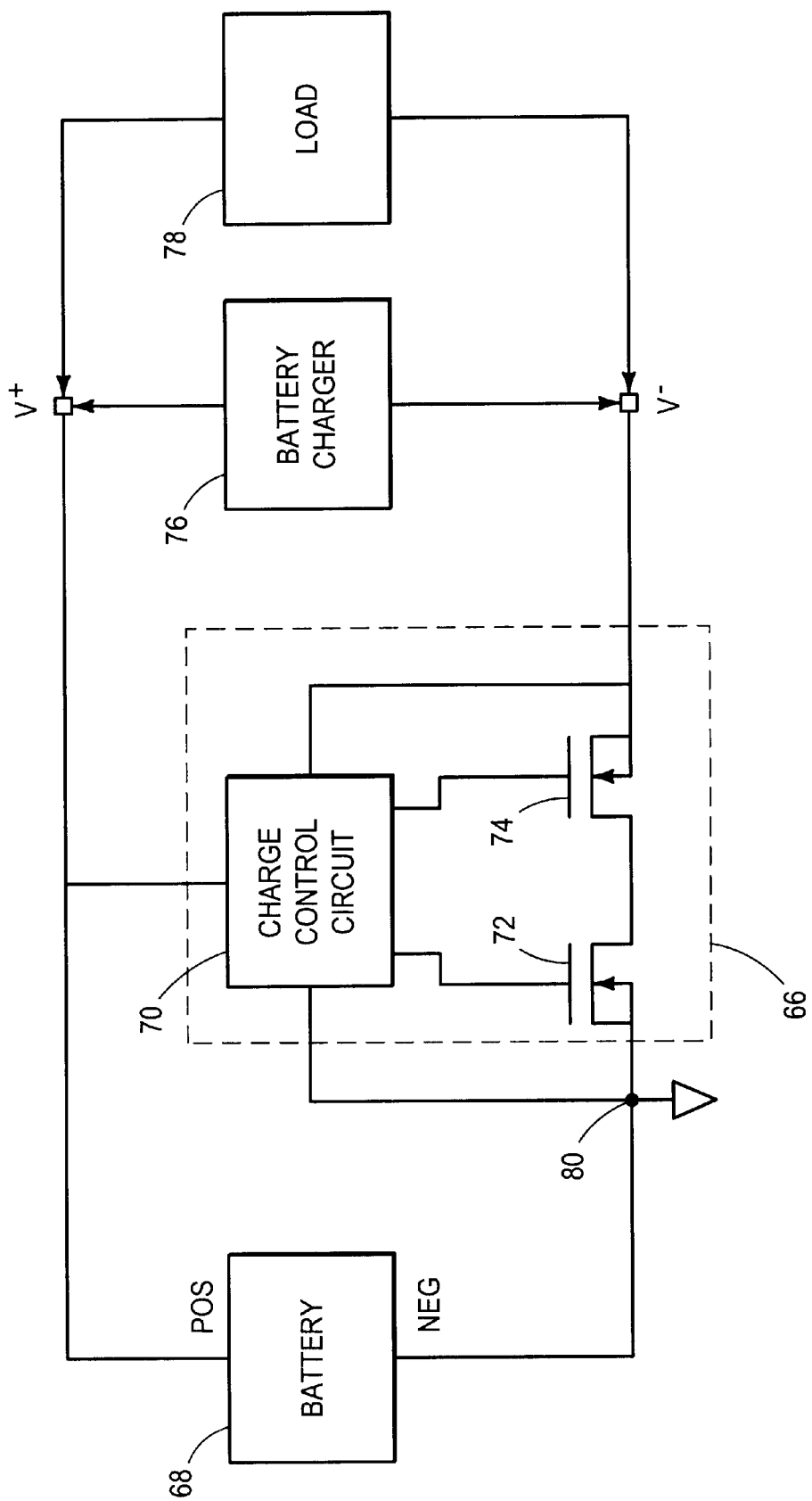
FIG. 4 is a schematic of a battery protection circuit using the transistors of FIG. 1 or 3.

Turning to FIG. 4, a typical application diagram of the utility of transistors illustrated in FIG. 1 or 3 is shown. A battery protection circuit 66 is illustrated having battery 68 coupled to battery charger 76 or to load 78 via transistors 72 and 74. Charge control circuit 70 is coupled to the control terminal of transistors 72 and 74 to control charge/discharge current to/from battery 68. Transistors 72 and 74 may exist on the same die as battery protection circuit 66, whose function is to control current flow into and out of battery 68. Transistors 72 and 74 are hereinafter considered to be on the same die as battery protection circuit 66, implemented as an integrated circuit.

In operation, battery protection circuit 66 either allows current from battery 68 to be delivered to load 78 via terminal V+ during discharging mode or battery protection circuit 66 allows current from battery charger 76 to be delivered to battery 68 via terminal V− during charging mode. Discharging mode of battery protection circuit 66 is defined when load 78 is coupled across terminals V+ and V− and charging mode of battery protection circuit 66 is defined when battery charger 76 is coupled across terminals V+ and V−. Charge control circuit 70 provides gate drive signals to transistors 72 and 74, to control current flow from the NEG terminal of battery 68 to the V− terminal of battery protection circuit 66 during charging mode and charge control circuit 70 provides gate drive signals to transistors 72 and 74, to control current flow from the V− terminal to the NEG terminal of battery 68 during discharging mode.

During charging mode, current is sourced from the NEG terminal of battery 68, through transistors 72 and 74 and into battery charger 76 via the V− terminal of battery protection circuit 66. Node 80 provides ground potential to charge control circuit 70. As the charging current flows through transistors 72 and 74, a potential develops across the source terminals of transistors 72 and 74 which causes a negative potential to exist at the V− terminal and battery protection circuit 66. The magnitude of the negative potential, $V_{neg}$, existing at terminal V−, during the charging mode, is $V_{neg} = (R_{ds72} + R_{ds74}) * I$. $R_{ds72}$ and $R_{ds74}$ is the resistance of transistors 72 and 74 when in the conductive state, respectively, and I is the current conducted by transistors 72 and 74 during the charging mode. $V_{neg}$, therefore, represents the magnitude of negative potential which exists on the source terminal of transistor 74 during the charging mode of battery protection circuit 66.

Another example of negative potential application to battery protection circuit 66 exists when the potential applied by battery charger 76 is greater than the potential across battery 68. Writing a voltage equation around the loop comprised of node 80, battery 68, battery charger 76, transistor 72 and transistor 74, the voltage at the V− terminal is calculated to be $V^- = 0 + V_{68} - V_{76}$, where $V_{68}$ is the voltage across battery 68 and $V_{76}$ is the voltage across battery charger 76. If, for example, battery voltage $V_{68}$ is equal to 6 volts and a 20 volt battery charger 76 is applied across the V+ and V− terminals, an equivalent voltage of −14 volts is effectively applied across transistors 72 and 74, creating a potentially destructive punch-through condition within NMOSFET's 72 and 74. It has been shown, that the use of devices 10 and/or 50 for transistors 72 and 74 within battery protection circuit 66, substantially eliminates the lateral punch-through condition as discussed above. In addition, potential applied to the body contact of devices 10 or 50 is substantially independent of the potential existing at substrate 12 due to the operation of insulating N-well region 16.

Thus, a semiconductor device used for battery protection circuits is disclosed, which can be used to accommodate a negative voltage on its source using a P-type substrate. Different voltages can be applied to the source of each device, for example, a zero or negative voltage with respect to the substrate, while allowing a different voltage to be applied to the substrate. A first embodiment shown in FIG. 1 illustrates a device which operates in high voltage applications as well as negative source voltage applications. The drain contact region is recessed by a dimension X from an insulated region. The X dimension provides for a minimum separation distance between N-type drain region 29 and insulator region 18 for high voltage applications, which substantially eliminates lateral surface punch-through. A second embodiment shown in FIG. 3 has a shaped gate structure which accommodates high voltage applications while eliminating the lateral surface punch-through by centering N-type drain region 62 from insulator regions 18 and 19 within P-type region 20.

What is claimed is:

1. A lateral semiconductor device substantially eliminating lateral surface punch through, comprising:

a first well region of a first conductivity type formed in a first surface of a substrate;

a second well region of a second conductivity type formed within the first well region;

a drain region of the first conductivity type formed within the second well region;

a first insulating region formed adjacent to the drain region on the first surface of the substrate, wherein a minimum lateral distance separating the nearest first insulating region from the drain region is established to substantially eliminate lateral surface punch through.

2. The lateral semiconductor device of claim 1, further comprising:

a body region of the second conductivity type formed within the second well region; and a second insulating region formed adjacent to the body region, wherein the second insulating region is fanned simultaneously with the first insulating region.

3. The lateral semiconductor device of claim 2, further comprising:

a source region of the first conductivity type formed within the second well region adjacent to the body region; and a gate structure formed between the source and drain regions.

4. The lateral semiconductor device of claim 3, wherein the gate structure comprises:

an oxide layer centered between the source and drain regions; and a gate electrode formed on the oxide layer.

5. The lateral semiconductor device of claim 4, wherein the gate electrode is formed using a polysilicon material.

6. A semiconductor device comprising:

a first well region of a first conductivity type formed in a first surface of a substrate;

a second well region of a second conductivity type formed within the first well region;

a drain region of the first conductivity type centered within the second well region;

a first gate structure formed adjacent to the drain region;

a second gate structure formed adjacent to the drain region, wherein the drain region is centered within the first and second gate structures;

a first source region of the first conductivity type formed adjacent to the first gate structure;

a second source region of the first conductivity type formed adjacent to the second gate structure;

a first body region of the second conductivity type formed adjacent to the first source region; and a second body region of the second conductivity type formed adjacent to the second source region.

7. The semiconductor device of claim 6, further comprising:

a first insulating region formed on the first surface of the substrate adjacent to the second well region; and a second insulating region formed on the first surface of the substrate adjacent to the second well region, wherein the first and second insulating regions are formed simultaneously.

* * * * *